United States Patent [19]

Kobayashi

[11] Patent Number: 5,398,004
[45] Date of Patent: Mar. 14, 1995

[54] HBT DIRECT-COUPLED LOW NOISE WIDEBAND MICROWAVE AMPLIFIER

[75] Inventor: Kevin W. Kobayashi, Torrance, Calif.
[73] Assignee: TRW Inc., Redondo Beach, Calif.
[21] Appl. No.: 194,754
[22] Filed: Feb. 9, 1994
[51] Int. Cl.⁶ ............................................ H03F 1/34
[52] U.S. Cl. .................................... 330/293; 330/104
[58] Field of Search ............... 330/103, 104, 291, 292, 330/293, 294, 302, 310, 311

[56] References Cited

U.S. PATENT DOCUMENTS

| | | | |
|---|---|---|---|
| 3,267,386 | 8/1966 | Davis et al. | 330/293 |
| 3,899,742 | 8/1975 | Yum et al. | 330/291 |
| 4,559,501 | 12/1985 | Akutagawa et al. | 330/293 |
| 4,916,409 | 4/1990 | Tracy | 330/104 X |

OTHER PUBLICATIONS

I. Kipnis, J. F. Kukielka, J. Wholey and C. P. Snapp "Silicon Bipolar Fixed and Variable Gain Amplifier MMICs for Microwave and Lightwave Applications Up to 6 GHz", IEEE 1989 Microwave and Millimeter-Wave Monolithic Circuits Symposium, pp. 101 through 104.

*Primary Examiner*—Steven Mottola

[57] ABSTRACT

A wideband low noise amplifier is provided which includes an input for receiving an input signal and an output for providing an amplified output signal which may vary over a wide frequency range while exhibiting minimum noise interference. The amplifier includes a first amplification stage having a first bipolar transistor with a base connected to the input, an emitter coupled to ground and a collector. A second amplification stage is provided which has second and third Darlington-connected bipolar transistors. The second and third transistors each have a base, collector and emitter with the emitter of the second transistor connected to the base of the third transistor. A first feedback path which includes a first feedback resistor is coupled between each of the collectors of the second and third transistors and the base of the second transistor. The collector of the first transistor is also connected to the base of the second transistor. A second feedback path is connected between the emitter of the second transistor and the base of the first transistor. The second feedback path has a second feedback resistor with an impedance selected so as to optimize noise match, provide gain-bandwidth adjustment and DC bias stabilization. In addition, the second feedback path may further include an inductor for providing an inductive reactance component to further optimize the noise match. Alternately, the inductor may be coupled between the input and the base of the first transistor.

18 Claims, 5 Drawing Sheets f1 = 0.3 GHz
f2 = 3.0 GHz

HBT DIRECT-COUPLED LOW NOISE WIDEBAND MICROWAVE AMPLIFIER

BACKGROUND OF THE INVENTION

1. Technical Field

The present invention relates generally to transistor amplifiers and, more particularly, to low noise wideband direct-coupled microwave amplifiers which employ bipolar transistors such as a common-emitter transistor and Darlington-connected pair of transistors with a feedback topology.

2. Discussion

Broadband low noise direct-coupled microwave amplifiers are increasingly being required to serve the needs for a variety of modern electronic applications which operate over a wide frequency range extending from DC to microwave frequencies. Some applications include instrumentation systems, radio and cellular phone systems, personal communication networks (PCN), high definition television (HDTV), cable television (CATV), optical communications, and global positioning satellite (GPS) systems. These and other applications commonly operate over wide frequency bandwidths which may cover a frequency range from zero hertz (i.e., DC) extending to over five Gigahertz. For example, zero to five Gigahertz transimpedance amplifiers are particularly useful with digital optical communication receivers which operate at data rates up to ten Gigabits per second (10 Gbit/s) and faster. In another example, direct-coupled microwave amplifiers are useful for oscilloscope applications which operate at microwave frequencies.

These and other applications generally require what is known as a direct-coupled amplifier design topology which can achieve broadband low noise performance and operate into the microwave frequency range. In the past, low frequency performance below 100 Megahertz has been achieved with the use of silicon and GaAs bipolar technology. This essentially precludes the use of HEMT or FET technology which is more commonly used to achieve lower noise levels, but typically only at frequencies exceeding a few hundred Megahertz. This is because state of the art silicon technologies operating at high frequencies generally do not offer low noise performance over an extended frequency range. However, modern and future applications such as HDTV increasingly require wideband low noise performance over a broad frequency range such as 45 Megahertz to 2.5 Gigahertz, for one example.

Broadband direct-coupled amplifiers are commonly implemented with a feedback topology and generally contain a number of transistors, resistors and level-shifting diodes. The conventional common-emitter feedback topology typically employs a single transistor. In bipolar technology, a popular wideband direct-coupled topology is the Darlington feedback amplifier. The Darlington feedback amplifier includes a Darlington-connected pair of bipolar transistors with internal feedback characteristics which generally allows for the realization of wider bandwidths.

The conventional Darlington feedback amplifier can typically achieve broad frequency bandwidths which cover a range as high as eighty percent of the cut-off frequency for a number of existing microwave devices. These types of wideband amplifiers are commonly designed in single and multiple stages and require proper adjustment of parallel and series feedback resistors so as to realize added feedback. However, the conventional broadband amplifier approaches commonly utilize feedback paths which generally introduce additional unwanted noise into the amplifier output. In other words, conventional wide bandwidth amplifiers such as the Darlington-connected feedback type are generally achieved at the expense of realizing higher amounts of noise. Also, these conventional amplifier approaches usually fail to optimize source impedance matching for microwave devices which results in added noise.

It is therefore desirable to provide for a microwave amplifier which may operate over a wide frequency bandwidth while sustaining minimum noise interference. It is also desirable to provide for such an amplifier which may be designed so that gain-bandwidth performance and noise interference may be adjusted independent of one another. More particularly, it is further desirable to provide for a two-stage direct-coupled microwave amplifier which has a Darlington-connected pair of transistors directly coupled to a common-emitter transistor in a manner which provides a wideband low noise direct-coupled amplifier, and which does not adversely suffer from the adverse drawbacks which presently exist with many of the conventional approaches.

SUMMARY OF THE INVENTION

In accordance with the teachings of the present invention, a wideband low noise microwave amplifier is provided which includes an input for receiving an input signal and an output for providing an amplified output signal which may vary over a wide frequency range while exhibiting minimum noise interference. The amplifier includes a first amplification stage having a first bipolar transistor with a base connected to the input, an emitter coupled to ground and a collector. A second amplification stage is provided which has second and third Darlington-connected bipolar transistors. The second and third transistors each have a base, collector and emitter, with the emitter of the second transistor connected to the base of the third transistor. A first feedback path which has a first feedback resistor is provided between each of the collectors of the second and third transistors and the base of the second transistor. The collector of the first transistor is connected to the base of the second transistor. A second feedback path is connected between the emitter of the second transistor and the base of the first transistor. The second feedback path has a second feedback resistor with an impedance selected so as to optimize noise match, provide gain-bandwidth adjustment and DC bias stabilization. The second feedback path may further include an inductor for providing an inductive reactance component. According to alternate embodiments, the inductor may be coupled between the input and the base of the first transistor.

BRIEF DESCRIPTION OF THE DRAWINGS

Other objects and advantages of the present invention will become apparent to those skilled in the art upon reading the following detailed description and upon reference to the drawings in which.

DETAILED DESCRIPTION OF THE PREFERRED EMBODIMENTS

Figure 1:
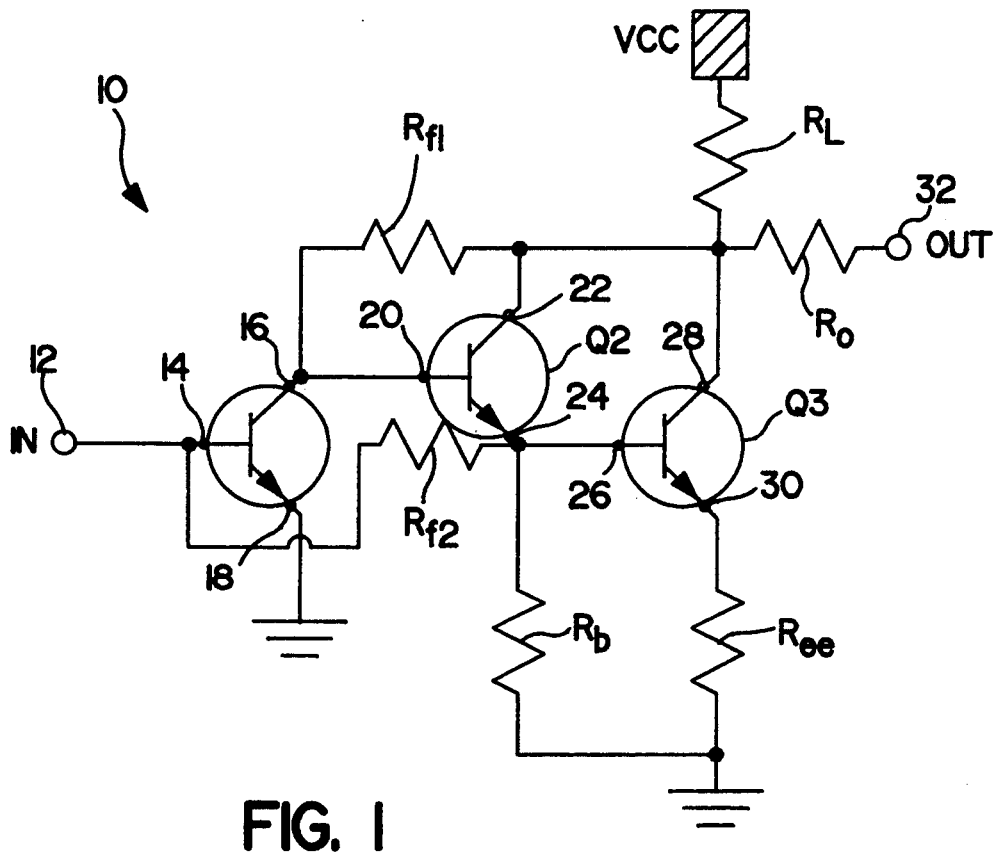
FIG. 1 is a circuit diagram which illustrates a direct-coupled low noise microwave amplifier in accordance with a preferred embodiment of the present invention.

Turning now to FIG. 1, a broadband low noise direct-coupled microwave amplifier 10 is shown in a circuit configuration according to a preferred embodiment of the present invention. The amplifier 10 includes two amplifier gain stages configured in a direct-coupled two-stage amplifier topology which employs bipolar transistors with a feedback arrangement. The present invention as described hereinafter is able to achieve low noise amplification over a wideband frequency range extending from DC to microwave frequencies in a manner suitable for modern and future electronics and communications systems.

More specifically, amplifier 10 has a first or common-emitter amplification stage which is made up of a first heterojunction bipolar transistor (HBT) Q1. Transistor Q1 has a base 14, collector 16 and emitter 18. The base 14 of transistor Q1 is connected to an input port 12 for receiving an input signal that is to be amplified. The emitter 18 of transistor Q1 is directly connected to ground, while the collector 16 is directly coupled to a second amplification stage.

The second amplification stage is a Darlington feedback amplification stage which is made up of a pair of Darlington-connected heterojunction bipolar transistors Q2 and Q3. Transistors Q2 and Q3 each have a respective base 20 or 26, collector 22 or 28, and emitter 24 or 30. The emitter 24 of transistor Q2 is directly connected to the base 26 of transistor Q3 in a manner well known to those in the art for forming a Darlington-connected amplification stage. The Darlington feedback amplification stage further includes a series feedback resistor $R_{ee}$ connected between the emitter 30 of transistor Q3 and ground. A bias resistor $R_b$ is connected between the emitter 24 of transistor Q2 and the grounded end of series feedback resistor $R_{ee}$. Series feedback resistor $R_{ee}$ and bias resistor $R_b$ form local series and shunt feedback paths for the second amplification stage.

The Darlington feedback amplification stage further has the collectors 22 and 28 of transistors Q2 and Q3 directly connected together. A five volt power supply $V_{cc}$ is coupled to the collectors 22 and 28 of respective transistors Q2 and Q3 via a load resistor $R_L$. In addition, collectors 22 and 28 of transistors Q2 and Q3 are also connected to an output port 32 via an output matching resistor $R_o$. Output port 32 outputs low noise amplified signals in response to input signals over a broadband frequency range with minimal noise.

The amplifier 10 further includes a first feedback resistor $R_{11}$ connected between the commonly connected collectors 22 and 28 of transistors Q2 and Q3 and the base 20 of second transistor Q2 to form a shunt feedback path for the second amplification stage. The first feedback resistor $R_{f1}$ is also connected to the collector 16 of transistor Q1. Accordingly, the collector 16 of transistor Q1 is directly coupled to the base 20 of transistor Q2. The feedback resistor $R_{f1}$, in addition to the effective output resistance as determined by resistors $R_L$, $R_o$ and the system impedance, act as the AC load of the first amplification stage. Feedback resistor $R_{f1}$ may be selected so as to achieve a desired gain-bandwidth performance by determining the effective AC load of the first amplification stage and the amount of feedback for the second amplification stage. In addition, first feedback resistor $R_{f1}$ also provides a current source for biasing transistor Q1.

The amplifier 10 according to the present invention further includes a second feedback path with a second feedback resistor $R_{12}$ connected between the emitter 24 of transistor Q2 and the base 14 of transistor Q1. The second feedback resistor $R_{f2}$ has an impedance selected so as to determine the effective impedance looking out of the base 14 of transistor Q1 toward the input port 12. Therefore, second feedback resistor $R_{f2}$ can be adjusted to change the effective impedance and to achieve optimal noise match. Second feedback resistor $R_{f2}$ also provides RF shunt feedback which can be adjusted to determine the gain-bandwidth response and input matching to the system impedance. In addition, second feedback resistor $R_{f2}$ completes self-biasing of transistor Q1 by providing a base current to transistor Q1 and by providing DC bias stabilization. Accordingly, feedback resistor $R_{f2}$ can be adjusted for purposes of achieving an optimal combination of gain, noise figure, and input return-loss performance.

The first amplification stage operates as a low noise common-emitter pre-amplifier stage which generally determines the noise figure for the overall two-stage amplifier 10. The second amplification stage or Darlington feedback amplifier stage provides wideband gain and output drive capability. The bandwidth characteristics of the Darlington feedback stage can be optimized by changing the first and second feedback resistors $R_{f1}$ and $R_{f2}$, without degrading the overall noise figure of the amplifier 10. In effect, the first feedback resistor $R_{f1}$, in addition to the effective output resistance determined by resistors $R_L$, $R_o$ and the system impedance of say approximately 50 Ohms, act as the AC load of the first amplification stage. The first feedback resistor $R_{f1}$ may be adjusted to change the gain-bandwidth performance by changing the effective AC load of the first amplification stage, and the amount of shunt feedback for the second amplification stage, in addition to providing a current source for biasing transistor Q1. While the second feedback resistor $R_{f2}$ is selected to effect the overall gain, bandwidth, noise figure and input return-loss.

The minimum noise source impedance looking out of the base 14 of transistor Q1 is generally known to be dependent on the size and bias of the heterojunction bipolar transistor (HBT) Q1. For HBT devices at low frequencies of less than 2 GHz, the minimum noise source impedance is substantially real with a negligible amount of inductive reactance component. However, at higher frequencies the imaginary inductive reactance component of the optimum noise source impedance becomes more significant. Therefore, by properly selecting the size and bias of the HBT transistors and feedback resistors $R_{f1}$ and $R_{f2}$, a minimum noise source impedance may be chosen to coincide with the impedance presented from the system impedance in order to optimize the overall amplifier performance with the present direct-coupled amplifier topology.

Figure 4:
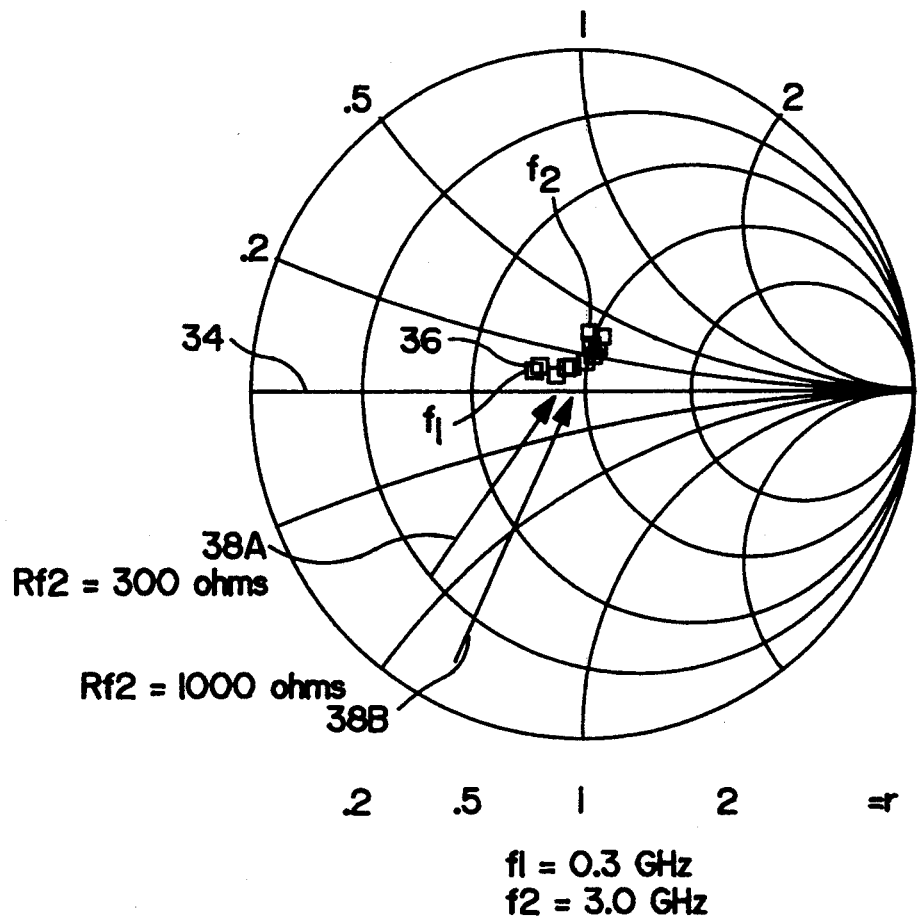
FIG. 4 is a Smith chart which illustrates impedance characteristics associated with achieving an optimized effective impedance for the microwave amplifier.

To illustrate the impedance matching characteristics for a bipolar transistor amplifier, FIG. 4 illustrates a Smith chart which plots the gamma opt impedance (i.e., optimum source impedance vs. frequency required to achieve minimum noise figure from a given HBT device) as illustrated by reference numeral 36 in terms of magnitude and angle. The impedance data plotted in FIG. 4 represents impedance characteristics exhibited by one example of a $2\times 10$ $\mu m^2$ quad-emitter device that has a bias current of about 4 mA and which was chosen for optimum noise figure and a 50 Ohm input impedance match. The source impedance looking out of the base 14 of transistor Q1 and into the effective source impedance 38A and 38B is also shown plotted along resistance component line 34 for two different values of feedback resistor $R_{f2}$. The effective source impedance includes the effective impedance looking into the global shunt feedback resistor $R_{f2}$ in parallel with the 50 Ohm system impedance. By incorporating a larger shunt feedback resistor $R_{f2}$, the source impedance may be increased in magnitude in order to obtain a closer match to the optimum source impedance 36, which may result in minimum noise figure of transistor Q1 at a specified bias condition.

Figure 5:
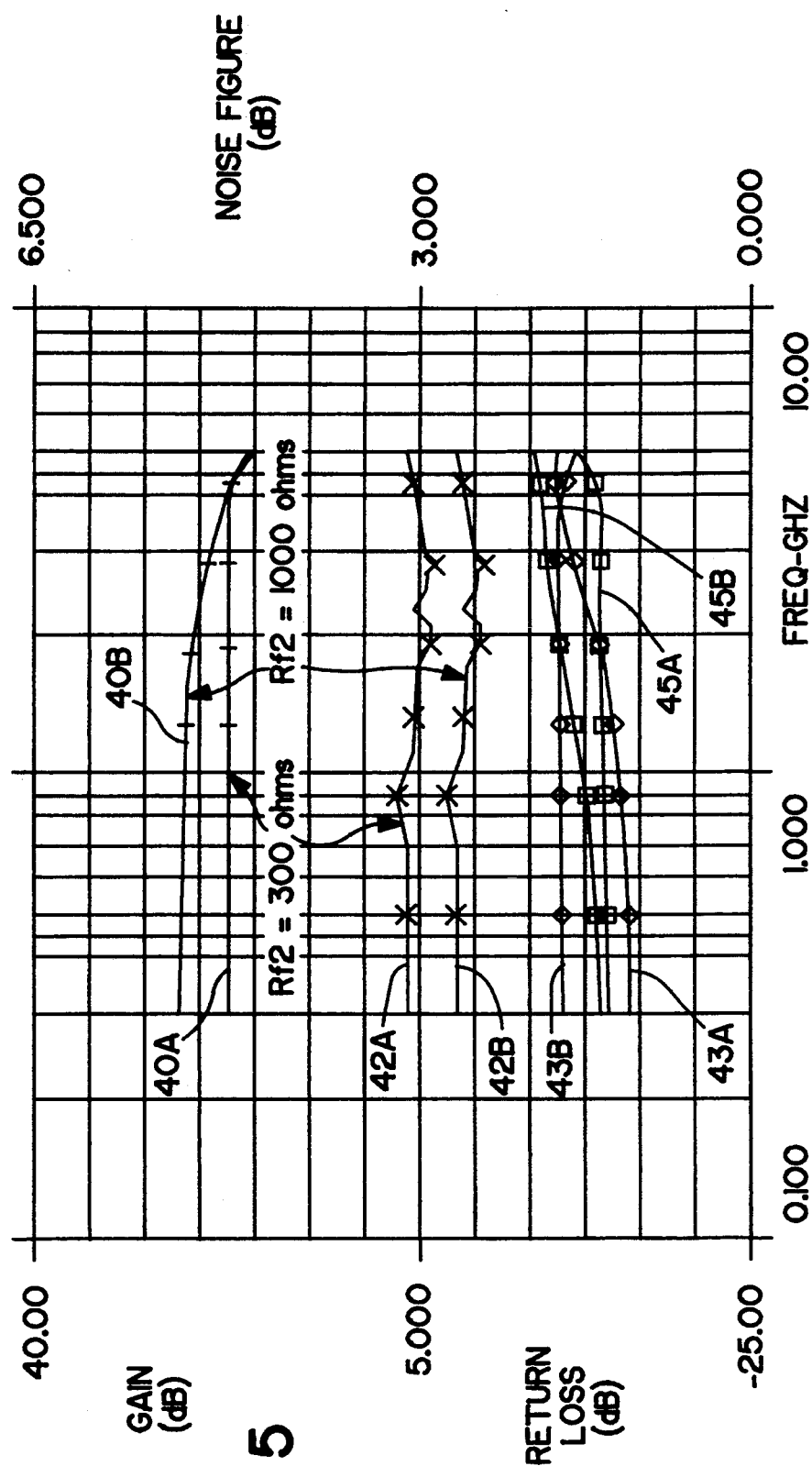
FIG. 5 is a graphical representation of performance data measured for one example of the microwave amplifier.

The resulting effect on performance for one example of the amplifier 10 is simulated in FIG. 5. This example includes a system impedance of 50 ohms, load resistor $R_L$ set at 105 ohms, output resistor $R_o$ equal to 10 ohms, and resistors $R_{ee}$ and $R_b$ set at 5 and 350 ohms, respectively. The first feedback resistor $R_{f1}$ has a resistance of 750 ohms, and the second feedback resistor $R_{12}$ according to this example has resistances of 300 ohms and 1,000 ohms. With second feedback resistor $R_{f2}$ equal to 300 ohms, a substantially constant gain 40A of approximately 22 dB is achieved over a 3 dB frequency bandwidth of around 5 Gigahertz with a noise FIG. 42A of about 2.3 dB. With feedback resistor $R_{f2}$ changed to 1,000 ohms, the gain 40B rises to about 27 dB; However, the bandwidth declines to a 3 dB cutoff frequency range of about 3 Gigahertz and exhibits a noise FIG. 42B of about 2.8 dB. Input return losses 45A and 45B and output return losses 43A and 43B are also plotted for resistor $R_{f2}$ selected equal to 300 ohms and 1000 ohms, respectively.

An increase in size of second feedback resistor $R_{f2}$ generally increases the overall amplification gain, lowers the bandwidth, and significantly reduces noise figure by about 0.5 dB. The proper size selections for feedback resistors $R_{f1}$ and $R_{f2}$ for a given system will enable the achievement of the desired gain-bandwidth and optimum noise performance. For instance, first and second feedback resistors $R_{f1}$ and $R_{f2}$ may both be set equal to 500 ohms in the above example to achieve a gain of about 30 dB, a bandwidth of nearly 2.4 Gigahertz and a noise figure of approximately 2.5 dB. In another example, feedback resistors $R_{f1}$ may be set to 500 ohms and feedback resistor $R_{f2}$ set to 1,000 ohms to achieve a gain of 32 dB, a bandwidth of 2 Gigahertz and a noise figure of 2.3 dB. Finally, first feedback resistor $R_{f1}$ may be equal to 250 ohms, while feedback resistor $R_{f2}$ is equal to 300 ohms to achieve a gain of 20 dB, a bandwidth of 5 Gigahertz and a noise figure of about 2.8 dB. The second feedback resistor $R_{f2}$ has a rather significant impact on the noise figure while first feedback resistor $R_{f1}$ tends to have more of an influence on the operating frequency bandwidth.

Figure 2:
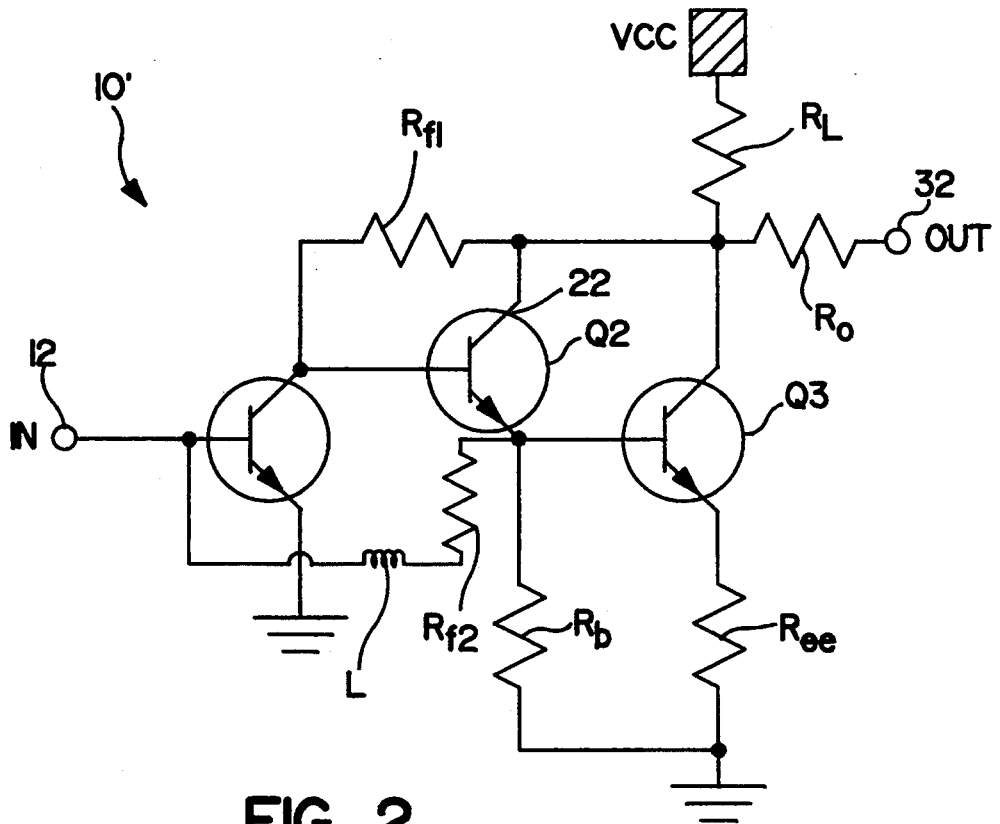
FIG. 2 is a circuit diagram which illustrates the direct-coupled low noise microwave amplifier employing an inductor in accordance with an alternate embodiment of the present invention.

With particular reference to FIG. 2, an alternate embodiment of the present invention is shown therein as amplifier 10'. The alternate embodiment includes the addition of an inductor L connected in series with the second feedback resistor $R_{f2}$. The inductor L is selected to provide an inductive reactance component that helps to further match the effective reactance component that is exhibited by a given system input. Referring back to the Smith chart in FIG. 4, one will realize how the addition of an imaginary inductive reactive component further enhances the impedance match. According to the impedance characteristics on the Smith chart, it is shown that the inductive reactance component increases at higher frequencies. The addition of inductor L with a size of about 2 or 3 nH causes the overall effective impedance to be more closely matched. Accordingly, one is able to better optimize the overall amplifier performance with the addition of both real and imaginary components of impedance.

Figure 2A:
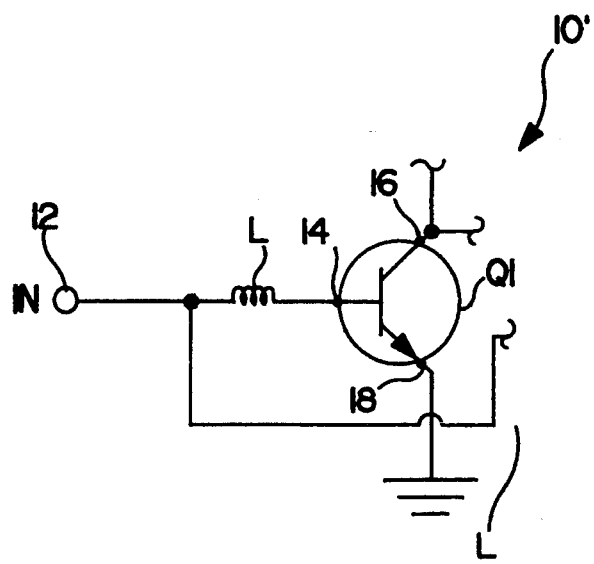
FIG. 2A is a circuit diagram which illustrates a portion of the direct-coupled low noise microwave amplifier with the inductor connected according to an another alternate embodiment.
Figure 2B:
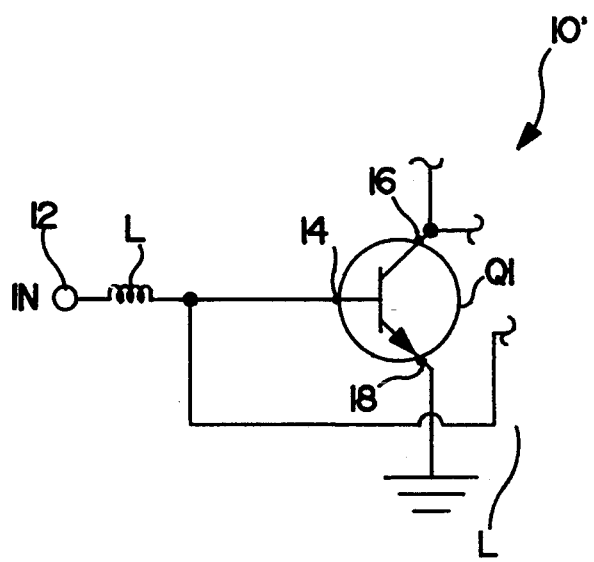
FIG. 2B is a circuit diagram which illustrates a portion of the amplifier with the inductor connected in yet another alternate embodiment.

It should be appreciated that the use of an inductor L to achieve enhanced impedance matching may be connected in other manners. For instance, inductor L may be connected between the input port 12 and the base 14 of transistor Q1 as shown in FIGS. 2A and 2B. According to FIG. 2A, the inductor L is connected in series with the base 14 of transistor Q1 and is therefore in series with the second feedback path. Likewise, inductor L may be connected to input port 12 in series with the source impedance as shown in FIG. 2B. All three alternate embodiments described in FIGS. 2, 2A and 2B present an inductive reactance in addition to the real component of impedance that is presented to the base 14 of transistor Q1. As a consequence, amplifier 10' more closely matches the optimum source impedance thereby resulting in lower noise.

Figure 3:
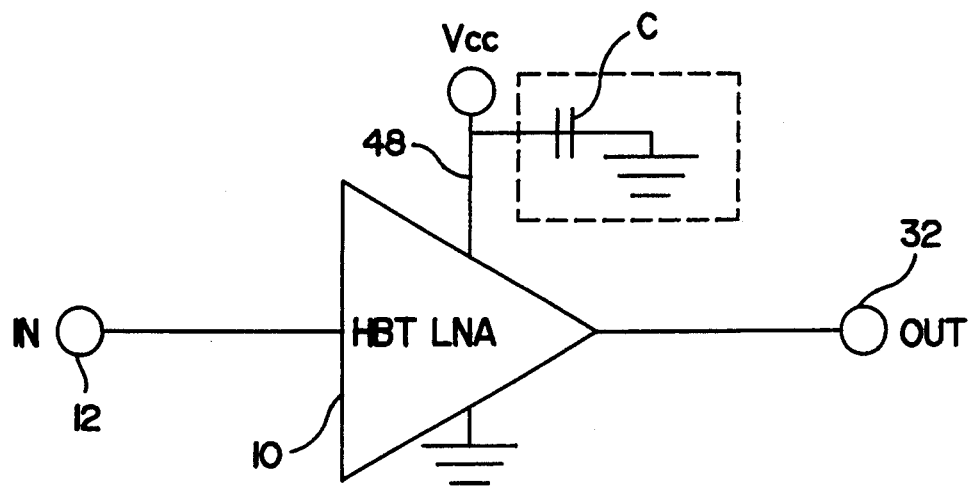
FIG. 3 is a block diagram which illustrates a bias implementation of the microwave amplifier shown in FIG. 1.

Referring now to FIG. 3, the block diagram of the direct-coupled amplifier 10 is shown therein. The external power source $V_{cc}$ is connected to the amplifier 10 via a supply line 48. A bypass capacitor C is connected between the voltage supply-line 48 and ground. The addition of capacitor C effectively shunts out high frequency noise that may be present along the supply line 48.

Figure 6:
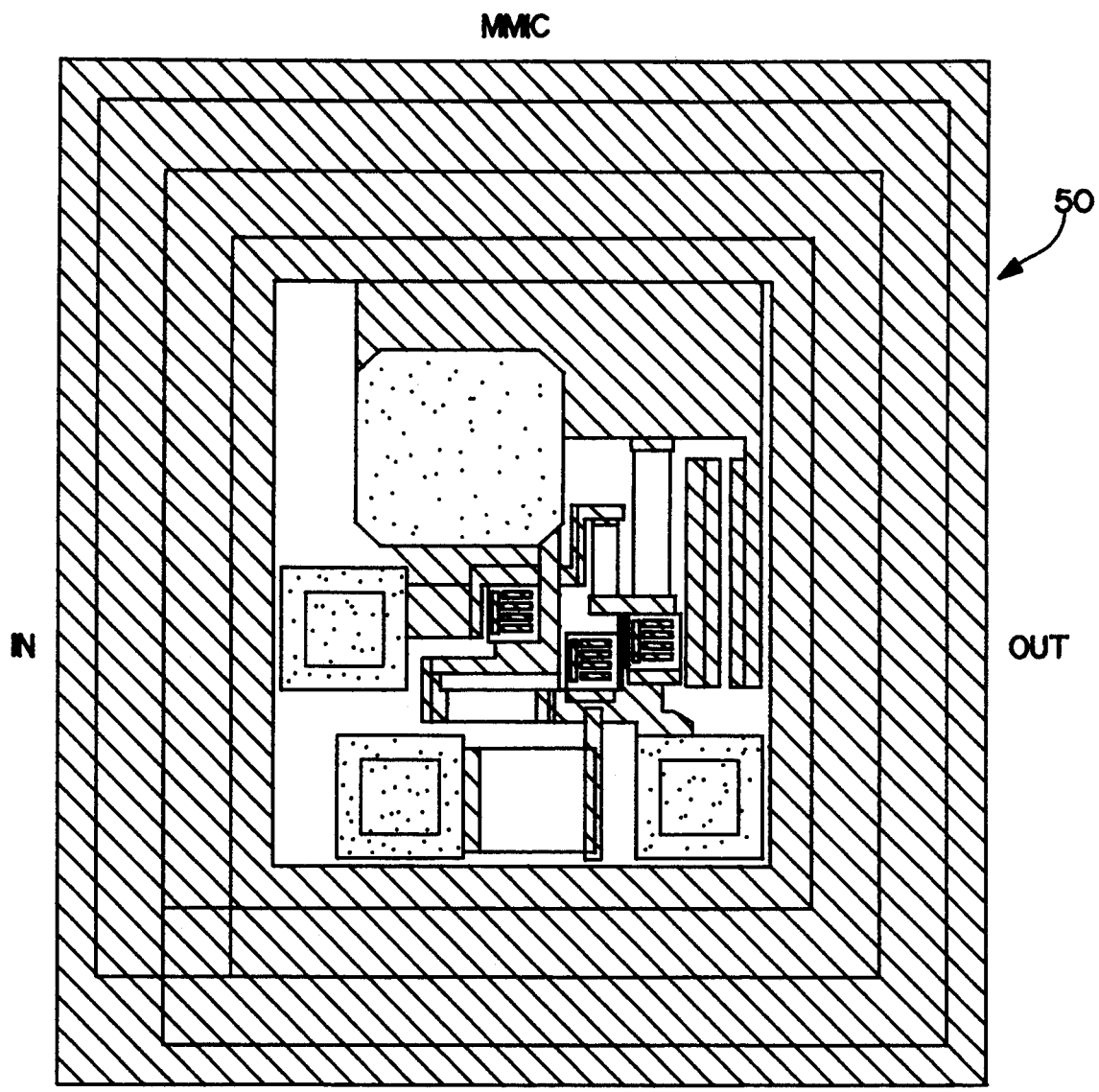
FIG. 6 is a chip layout of the direct-coupled low noise microwave amplifier fabricated on an MMIC chip.

Finally, turning to FIG. 6, a layout of a monolithic microwave integrated circuit (MMIC) chip 50 is shown therein which includes the amplifier 10 described herein. The total chip size is approximately 270 by 305 $\mu m^2$. As much as 40,000 of these amplifier chips may be formed on a single three inch GaAs wafer according to well known semiconductor technology. According to modern manufacturing costs, this translates into a compact low cost amplifier 10. In addition, the amplifier 10 shown herein employs an HBT digital design and includes a backside via process. Furthermore, improved bandwidth performance may also be possible from the use of InP based amplifiers in accordance with the present invention. Alternately, silicon bipolar transistors may also be employed.

In operation, the low noise broadband direct-coupled amplifier 10 is designed with feedback resistor's $R_{f1}$ and $R_{f2}$ having selected resistances that may provide optimum gain-bandwidth and noise performance for a given system. The first feedback resistor $R_{f1}$ effects the gain-bandwidth performance by determining the effective AC load of the first amplification stage and the amount of shunt feedback for the second amplification stage, in addition to providing a current source for biasing transistor Q1. The second feedback resistor $R_{f2}$ provides feedback which may also determine the gain-bandwidth response and input matching to the system impedance. Also, second feedback resistor $R_{f2}$ further provides self-biasing of transistor Q1 and effects the gain, noise figure and input return-loss performance thereof. Accordingly, the selection of feedback resistors $R_{f1}$ and $R_{f2}$ are selected to provide optimum impedance match between the system impedance and the optimum noise source impedance. According to the amplifier 10' in the alternate embodiments, the addition of an inductor L further allows for the addition of an inductive reactance component which may further enhance the impedance matching, especially at higher frequencies.

In view of the foregoing, it can be appreciated that the present invention enables the user to achieve a low noise wideband amplifier. Thus, while this invention has been disclosed herein in connection with a particular example thereof, no limitation is intended thereby except as defined by the following claims. This is because the skilled practitioner will recognize that modifications can be made without departing from the spirit of this invention after studying the specification and drawings.

What is claimed is:

1. A wideband low noise amplifier comprising:
   an input for receiving an input signal;
   a first amplification stage including a first bipolar transistor having a base connected to the input, an emitter coupled to ground and a collector;
   a second amplification stage having at least a second bipolar transistor, said second transistor having a base, collector and emitter;
   means for connecting the collector of the first transistor to the base of the second transistor;
   a first feedback path with a resistive element coupling the collector of the second transistor to the base of the second transistor and the collector of said first transistor;
   a second feedback path coupled between the emitter of the second transistor and the base of the first transistor; and
   an output coupled to the collector of the second transistor for providing an amplified output signal which exhibits low noise over a broad frequency range.

2. The amplifier as defined in claim 1 wherein said second amplification stage comprises a pair of Darlington-connected bipolar transistors including the ,second transistor connected to a third bipolar transistor having a base, collector and emitter, with the emitter of the second transistor connected to the base of the third transistor.

3. The amplifier as defined in claim 1 wherein said first and second feedback paths each comprise a resistor with an impedance selected so as to optimize effective source impedance and provide a broadband low noise amplification.

4. The amplifier as defined in claim 3 wherein said second feedback path further comprises an inductor for providing an inductive reactance component so as to further optimize the effective source impedance.

5. The amplifier as defined in claim 3 further comprising an inductor coupled to the base of said first transistor for providing an inductive reactance component so as to further optimize the effective source impedance.

6. The amplifier as defined in claim 2 wherein said first, second and third transistors each comprise a heterojunction bipolar transistor.

7. The amplifier as defined in claim 1 wherein said first amplification stage comprises a common-emitter amplifier.

8. The amplifier as defined in claim 2 further comprising a voltage source coupled to the collector of the second and third transistors via a load resistor.

9. The amplifier as defined in claim 2 wherein the emitter of the second transistor is further coupled to ground via a third resistor and the emitter of the third transistor is coupled to ground via a fourth resistor.

10. A wideband low noise direct-coupled amplifier comprising:
    an input for receiving an input signal;
    a common-emitter amplification stage including a first bipolar transistor having a base connected to the input, an emitter coupled to ground and a collector;
    a Darlington feedback amplification stage having second and third Darlington-connected bipolar transistors said second and third transistors each having a base, collector and emitter with the emitter of the second transistor connected to the base of the third transistor, and further having a first feedback path with a first resistor coupled between each collector of the second and third transistors to the base of the second transistor;
    means for connecting the collector of the first transistor to the base of the second transistor;
    a second feedback path with a second resistor coupled between the emitter of the second transistor and the base of the first transistor; and
    an output coupled to the collector of the second and third transistors via a resistive load for providing an amplified output signal which exhibits low noise over a broad frequency range.

11. The amplifier as defined in claim 10 wherein said second feedback path further comprises an inductor for providing an inductive reactance component so as to further optimize effective source impedance.

12. The amplifier as defined in claim 10 further comprising an inductor coupled to the base of said first transistor for providing an inductive reactance component so as to further optimize effective source impedance.

13. The amplifier as defined in claim 10 wherein said first, second, and third transistors each comprise a heterojunction bipolar transistor.

14. The amplifier as defined in claim 10 further comprising a voltage source coupled to the collector of the second and third transistors via a load resistor.

15. The amplifier as defined in claim 10 wherein the emitter of the second transistor is further coupled to ground via a bias resistor and the emitter of the third transistor is coupled to ground via a second resistor.

16. A method of connecting a first amplifier stage having a first bipolar transistor to a second amplifier stage having second and third Darlington-connected bipolar transistors to form a two-stage wideband low noise direct-coupled microwave amplifier, said method comprising:

connecting an input port to a base of the first transistor which forms the first amplifier stage;

connecting a collector of the first transistor to a base of a second transistor that forms the second amplifier stage;

connecting a first resistor between the collector of the first transistor and collectors of the second and third transistors to form a first feedback path;

coupling a second resistor between an emitter of the second transistor and the base of the first transistor to provide a second feedback path, wherein the first and second resistors are each selected with an impedance so as to achieve optimum gain, bandwidth and noise; and connecting an output to the collectors of the second and third transistors to provide an amplified output signal.

17. The method as defined by claim 16 further comprising the step of connecting an inductor to said second feedback path so as to provide an inductive reactance component for impedance matching.

18. The method as defined by claim 16 further comprising the step of coupling an inductor to the base of said first transistor so as to provide an inductive reactance component for enhancing impedance matching.

* * * * *

UNITED STATES PATENT AND TRADEMARK OFFICE
CERTIFICATE OF CORRECTION

PATENT NO. : 5,398,004
DATED : 03/14/95
INVENTOR(S) : Kevin W. Kobayashi

It is certified that error appears in the above-indentified patent and that said Letters Patent is hereby corrected as shown below:

In the Drawings, Figures 3 and 4, should read as follows:

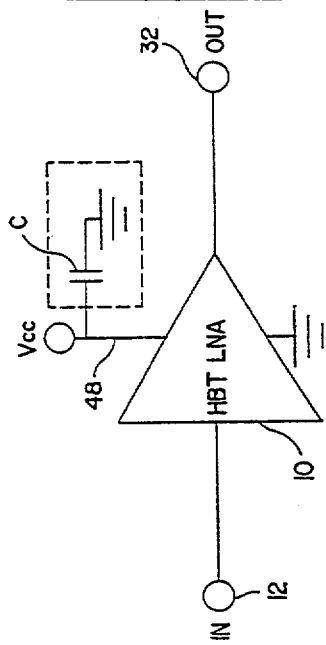

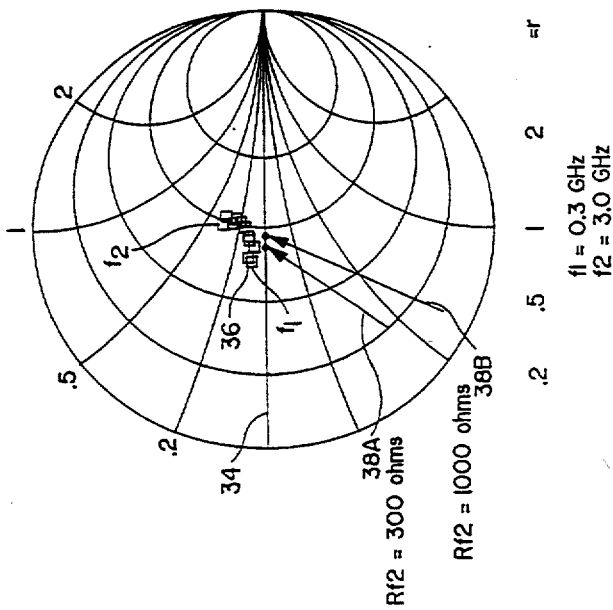

Signed and Sealed this

Twenty-fifth Day of July, 1995

Attest:

BRUCE LEHMAN

Attesting Officer     Commissioner of Patents and Trademarks